(12) United States Patent
Joshi et al.

(10) Patent No.: US 12,454,376 B2
(45) Date of Patent: Oct. 28, 2025

(54) SYSTEMS AND METHODS FOR COOLING AN ELECTRIC AIRCRAFT

(71) Applicant: Toyota Motor Engineering & Manufacturing North America, Inc., Plano, TX (US)

(72) Inventors: Shailesh Joshi, Ann Arbor, MI (US); Danny Lohan, Northville, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 224 days.

(21) Appl. No.: 18/490,998

(22) Filed: Oct. 20, 2023

(65) Prior Publication Data

US 2024/0043145 A1 Feb. 8, 2024

(51) Int. Cl.
*H05K 7/20* (2006.01)
*B64U 10/20* (2023.01)
*B64U 20/94* (2023.01)
*B64U 20/98* (2023.01)

(52) U.S. Cl.
CPC ............ *B64U 20/94* (2023.01); *B64U 10/20* (2023.01); *B64U 20/98* (2023.01); *H05K 7/20309* (2013.01); *H05K 7/20318* (2013.01); *H05K 7/20336* (2013.01); *H05K 7/2039* (2013.01)

(58) Field of Classification Search
CPC ............ F28D 15/0275; F28D 15/02; F28D 2021/0021; F28D 15/04; B64U 10/13; B64U 30/20; B64U 20/80; H01L 23/427; H05K 7/20336; H05K 7/20409

USPC .................................................... 361/679.52
See application file for complete search history.

(56) References Cited

U.S. PATENT DOCUMENTS

| | | | | |
|---|---|---|---|---|
| 3,801,843 | A * | 4/1974 | Corman | F28D 15/0275 310/58 |
| 6,062,302 | A * | 5/2000 | Davis | F28D 15/046 165/185 |
| 6,237,223 | B1 * | 5/2001 | McCullough | B22F 3/1103 29/890.032 |
| 10,641,556 | B1 * | 5/2020 | Al Omari | F28D 15/0233 |

(Continued)

FOREIGN PATENT DOCUMENTS

| CN | 214029125 U | 8/2021 |
|---|---|---|
| CN | 217283844 U | 8/2022 |

(Continued)

*Primary Examiner* — Mandeep S Buttar
(74) *Attorney, Agent, or Firm* — DINSMORE & SHOHL LLP

(57) ABSTRACT

The present disclosure is directed to systems and methods for cooling an electric aircraft. The system comprises an electronic device, a casing, at least one fin, and at least one PHP. The electronic device can generate heat. The electronic device can be housed within the casing. The fin can be attached to the outer wall of the casing. The PHP can be embedded within the fin, such that an evaporator section of the PHP is closest to the heat source and the condenser section of the PHP is furthest from the heat source. The PHP can also be placed within the casing. In some embodiments, the casing can have a plurality of slots. The fin can be shaped such that a single fin may slide into a pair of slots and come to rest adjacent to the casing, wherein a PHP can be embedded within the fin.

18 Claims, 8 Drawing Sheets

(56) References Cited

U.S. PATENT DOCUMENTS

| | | | | |
|---|---|---|---|---|
| 2002/0118511 A1* | 8/2002 | Dujari | ................... | H01L 23/427 |
| | | | | 174/16.3 |
| 2005/0103473 A1* | 5/2005 | Todd | ........................ | F28F 1/32 |
| | | | | 165/104.11 |
| 2015/0338170 A1* | 11/2015 | Mueller | .............. | F28D 15/0275 |
| | | | | 165/104.21 |
| 2018/0170553 A1* | 6/2018 | Wang | ...................... | B64U 20/80 |
| 2018/0362179 A1 | 12/2018 | Finger et al. | | |
| 2019/0009878 A1* | 1/2019 | Wang | ...................... | B64U 20/92 |

FOREIGN PATENT DOCUMENTS

| | | |
|---|---|---|
| EP | 3 816 562 A1 | 5/2021 |
| WO | 2011096850 A1 | 8/2011 |

* cited by examiner

SYSTEMS AND METHODS FOR COOLING AN ELECTRIC AIRCRAFT

BACKGROUND

Field

The present disclosure relates to systems and methods for cooling an electric aircraft.

Technical Background

Electric aircraft rely on electric motors to generate lift and/or thrust. Electric aircraft also use a variety of other electronic devices to control the electric motors as well as other aircraft functions. These electronic devices can be packaged together within a casing. These electronic devices can generate significant heat which requires cooling in order to keep the electronics within their optimal operating temperature range. Conventional cooling systems can involve the use of cooling fins or the casing itself, among other types of cooling devices. Conventional cooling systems can result in poor heat spreading capability around the surface of the package of electronics, which can result in lower cooling effectiveness and lower electronic functionality.

SUMMARY

Electronic devices generate heat during operation. As electronic devices are operated in more demanding situations, they will generate more and more heat. In order to operate effectively, electronics should be maintained within an ideal operating temperature range. Thus, electronic devices should be actively or passively cooled. Oftentimes electronic devices are surrounding by protective casings which can help to prevent damage to the electronic devices but which can further pool the heat generated by the electronic devices. Casings may utilize cooling systems to try to cool the electronic devices.

A conventional cooling system may involve the use of cooling fins placed on the outside of the casings or the casing itself to spread heat. These fins or the casing are typically placed in an airflow and the large surface area of the fins or casing allows heat to dissipate. However, conventional cooling systems can result in poor heat spreading along the fin or casing where the majority of the heat remains at the portion of the fin or casing closest to the heat source. This results in an inefficient use of the fin and casing as the entirety of the surface area of the fin and casing is not used for cooling. This effect is particularly relevant on electric aircraft where a motor providing lift or thrust can generate a significant amount of heat because of the high power demands on electronic devices of inverter circuits needed to power the electric aircraft. The electric aircraft can be an electric vertical takeoff and landing vehicle (eVTOL), for example. Therefore, there exists a need for a cooling system with increased cooling capacity in the same amount of space to keep up with the cooling demands of an electronic aircraft.

Embodiments of the present disclosure provide a more efficient cooling system than conventional fins by utilizing pulsating heat pipes (PHPs) in conjunction with a cooling fin and/or the casing. PHPs may also be referred to as oscillating heat pipes (OHPs). PHPs comprise a channel which has an evaporator section and a condenser section. A refrigerant is disposed within the channel. The refrigerant can travel between the evaporator section and condenser section, transforming between vapor phase and liquid phase. Such transformation can absorb and release heat, resulting in heat being absorbed from the electronic devices and released into an airflow at an end of the fin a distance from the casing. This can provide the advantage of higher heat transfer capability, spreading of high heat flux, ability to withstand g-forces experienced by an aircraft, performance insensitivity to orientation, and simplicity of structure.

Embodiments generally include a casing, wherein the casing includes a casing interior cavity, at least one electronic device, at least one cooling fin attached to the casing, and at least one PHP embedded within the at least one of the casing interior cavity or the cooling fin. A portion of the PHP closest to the electronic device generating heat can serve as an evaporator section of the PHP. A portion of the PHP furthest from the electronic device generating heat can serve as a condensing section of the PHP. In some embodiments, the system includes a casing with a plurality of slots, at least one cooling fin segment, wherein the at least one fin segment includes a U-shaped cross section and the fin segment is insertable into the plurality of slots of the casing. In another embodiment, the system is utilized on an eVTOL.

In one embodiment, an electric motor assembly includes a motor housing with an end face, a motor within a motor housing, an electronics assembly disposed on the motor housing end face, where the electronics assembly includes a casing with an interior cavity and an outer surface, at least one electronic device placed inside of the interior cavity, where the casing has at least one fin protruding from the casing outer surface and where the fin has a fin interior cavity, and one or more pulsating heat pipes disposed within the casing interior cavity, the fin interior cavity, or both the casing interior cavity and the fin interior cavity of the one or more fins.

In another embodiment, an electric motor assembly includes a motor housing with an end face, a motor within a motor housing, an electronics assembly disposed on the motor housing end face, where the electronics assembly includes a casing with an interior cavity, at least one electronic device placed inside of the interior cavity, and the casing outer surface includes a plurality of slots, one or more fin segments including a first fin, a second fin, and a connecting portion that connects the first fin to the second fin, wherein the first fin and the second fin are inserted into the plurality of slots such that the first fin and the second fin protrude from the outer surface of the casing, wherein the first fin and the second fin each comprises a fin interior cavity, and one or more pulsating heat pipes disposed within the fin interior cavity of the first fin and the second fin.

In yet another embodiment, an electric vertical takeoff and landing (eVTOL) vehicle includes an electric motor assembly includes a motor housing with an end face, a motor within a motor housing, an electronic assembly disposed on the motor housing end face, where the electronics assembly includes a casing with an interior cavity and an outer surface, at least one electronics device placed inside of the interior cavity, where the casing has at least one fin protruding from the casing outer surface and where the fin has a fin interior cavity, and one or more pulsating heat pipes disposed within the casing interior cavity, the fin interior cavity, or both the casing interior cavity and the fin interior cavity of the one or more fins.

Additional features and advantages of the technology described in this disclosure will be set forth in the detailed description which follows, and in part will be readily apparent to those skilled in the art from the description or recognized by practicing the technology as described in this disclosure, including the detailed description which follows, the claims, as well as the appended drawings.

BRIEF DESCRIPTION OF THE DRAWINGS

The following detailed description of the present disclosure may be better understood when read in conjunction with the following drawings in which.

Reference will now be made in greater detail to various embodiments of the present disclosure, some embodiments of which are illustrated in the accompanying drawings. Whenever possible, the same reference numerals will be used throughout the drawings to refer to the same or similar parts.

DETAILED DESCRIPTION

Figure 1:
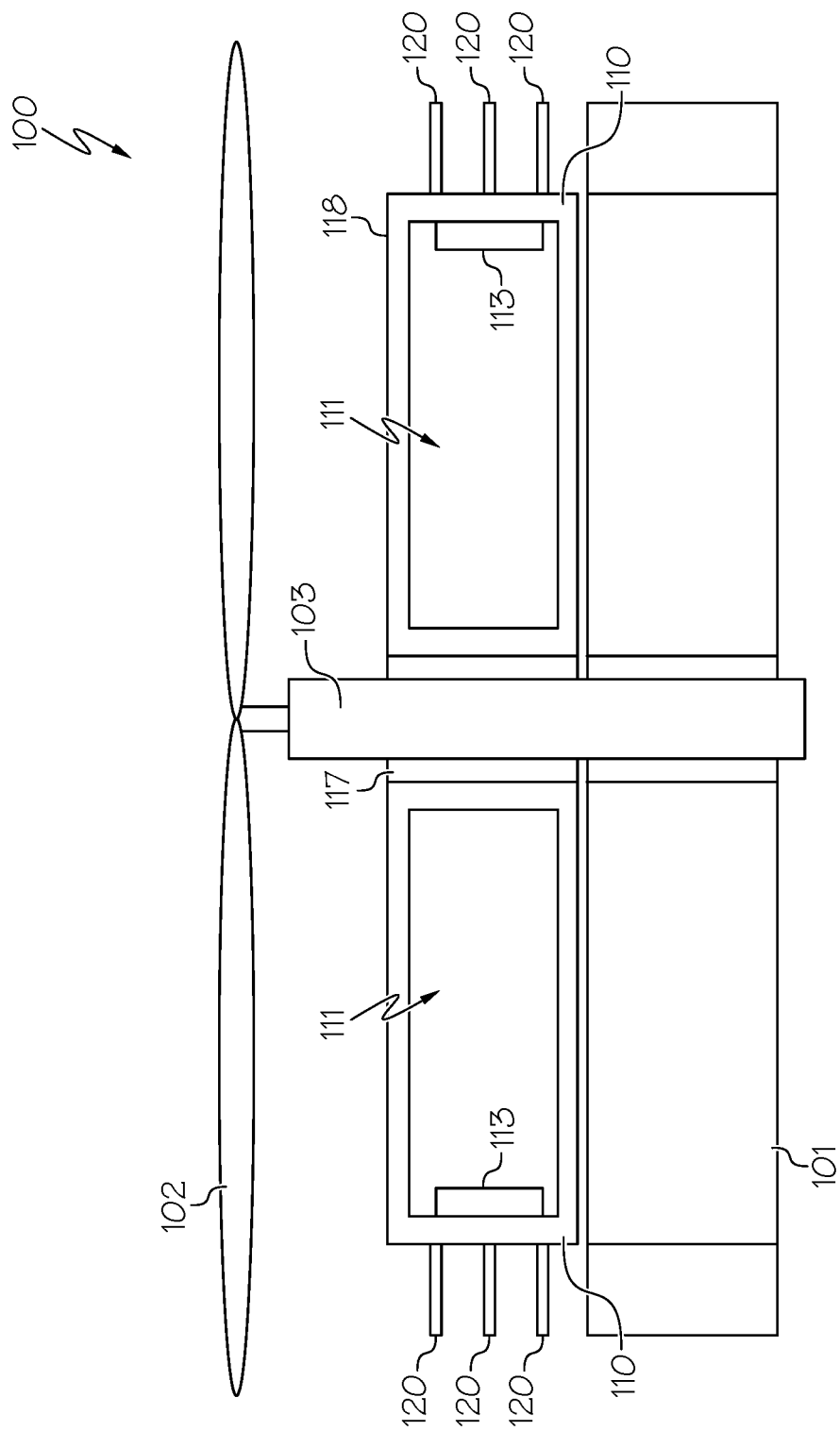
FIG. 1 schematically depicts a front section view of a motor, a casing, a plurality of fins, and a propeller assembly, according to one or more embodiments shown and described herein.

Embodiments of the present disclosure are directed to cooling systems employing PHP for electric motors and vehicles, such as eVTOLs. In embodiments, a PHP is embedded within a casing interior cavity or the width of a cooling fin attached to the casing so as to increase the heat spreading efficiency of the casing or the cooling fin. The portion of the PHP closest to the heat source serves as the evaporator. The portion of the PHP furthest from the heat source and placed within the air flow of the electronic aircraft serves as the condensing portion. This arrangement allows for more uniform heat spreading throughout the casing or fin, which in turn allows for more cooling capacity to remove heat from the electronic device.

The PHP has a complete loop such that the internal contents can be passed from the evaporator section to the condenser section, back to the evaporator section, and so on. In some embodiments, the PHP can be arranged in a winding manner such that a single PHP can include a plurality of condenser sections and a plurality of evaporator sections all within a single PHP. In some embodiments the plurality of condenser sections and the plurality of evaporator sections can all be embedded within a single cooling fin.

In some embodiments, a single PHP may be disposed within the casing interior cavity. In some embodiments, multiple PHPs may be disposed within the casing interior cavity.

In some embodiments, the casing can have a plurality of cooling fins arranged around the perimeter of the casing. In some embodiments, a single PHP may be arranged such that the single PHP is embedded within the plurality of cooling fins. In some embodiments, there may be a plurality of PHPs such that each of the plurality of cooling fins may have a single PHP embedded within each cooling fin.

In some embodiments, there may be a plurality of slots arranged around the casing. One or more fin segments may be shaped with a U-shaped top view so a single fin segment fits into two slots. In this arrangement, a single PHP may be embedded into each U-shaped fin segment.

The term "evaporator" refers to the portion of the PHP where liquid is converted from a liquid to a gas, absorbing heat. The term "condenser" refers to the portion of the PHP where gas is converted from a gas to a liquid, releasing heat.

Conventional cooling systems can limit heat spread and concentrate heat at the portion of the casing or fin closest to the heat source. This does not efficiently use the full area of the casing or fin as heat is not dissipated across the entire casing or fin, and also removes less heat from the heat source the casing or fin is designed to cool. The embodiments of the present disclosure can more effectively transfer heat throughout the entire casing or fin to more efficiently use the total area of the casing or fin and to increase the spread of heat throughout the entire casing or fin compared to conventional cooling systems. Embodiments can also disperse more heat away from the heat source compared to conventional cooling system.

Referring now to FIG. 1, an example system 100 is shown. The system 100 includes a casing 110, a motor 101, one or more electronic devices 113, a propeller 102, and a propeller shaft 103. The electronic device 113 is disposed within the casing interior cavity 111 (i.e., an enclosure defined by the casing 110). A plurality of fins 120 are attached to the casing outer surface 118. The propeller shaft 103 is coupled to the motor 101 and the propeller 102. Casing 110 may have a pass through 117 to allow the propeller shaft 103 to pass from the motor 101 to the propeller 102. The propeller 102 may provide lift, thrust, or a combination of lift and thrust. Note that while six fins 120 are shown in this embodiment, the system 100 may include any number of fins 120. It should be understood the arrangement of components of the system of FIG. 1 is for illustrative purposes, and that other arrangements are possible.

The electronic devices 113 in the casing interior cavity 111 can be one or more different electronic devices 113. The electronic devices 113 can be included in an inverter circuit, a gate drive and/or the like. The electronic devices 113 may include a capacitor, an insulated-gate bipolar transistor, a power MOSFET, or any other electronic devices. The electronic devices 113 can be the heat source of the system 100, wherein the electronic devices 113 generate heat during operation.

The casing 110 surrounding the electronic devices 113 can be any number of shapes, including but not limited to a cylinder, a toroid, or a rectangular prism. The casing 110 can be made of any number of materials, including but not limited to aluminum. The casing 110 includes at least one wall and an interior cavity. In some embodiments, there may be a plurality of casings 110 arranged together wherein each casing 110 has at least one fin 120 attached to it.

The system can include a fin 120. The system can include a plurality of fins 120. The fin 120 can be mounted to the casing 110. The fin 120 can be mounted to the casing 110 by various methods, including but not limited to soldering, brazing, and welding. In some embodiments, the fin 120 and the casing 110 may be made from a single piece of material. The fin 120 can be any number of shapes, including but not limited to a cylinder or a rectangular prism.

Figure 2:
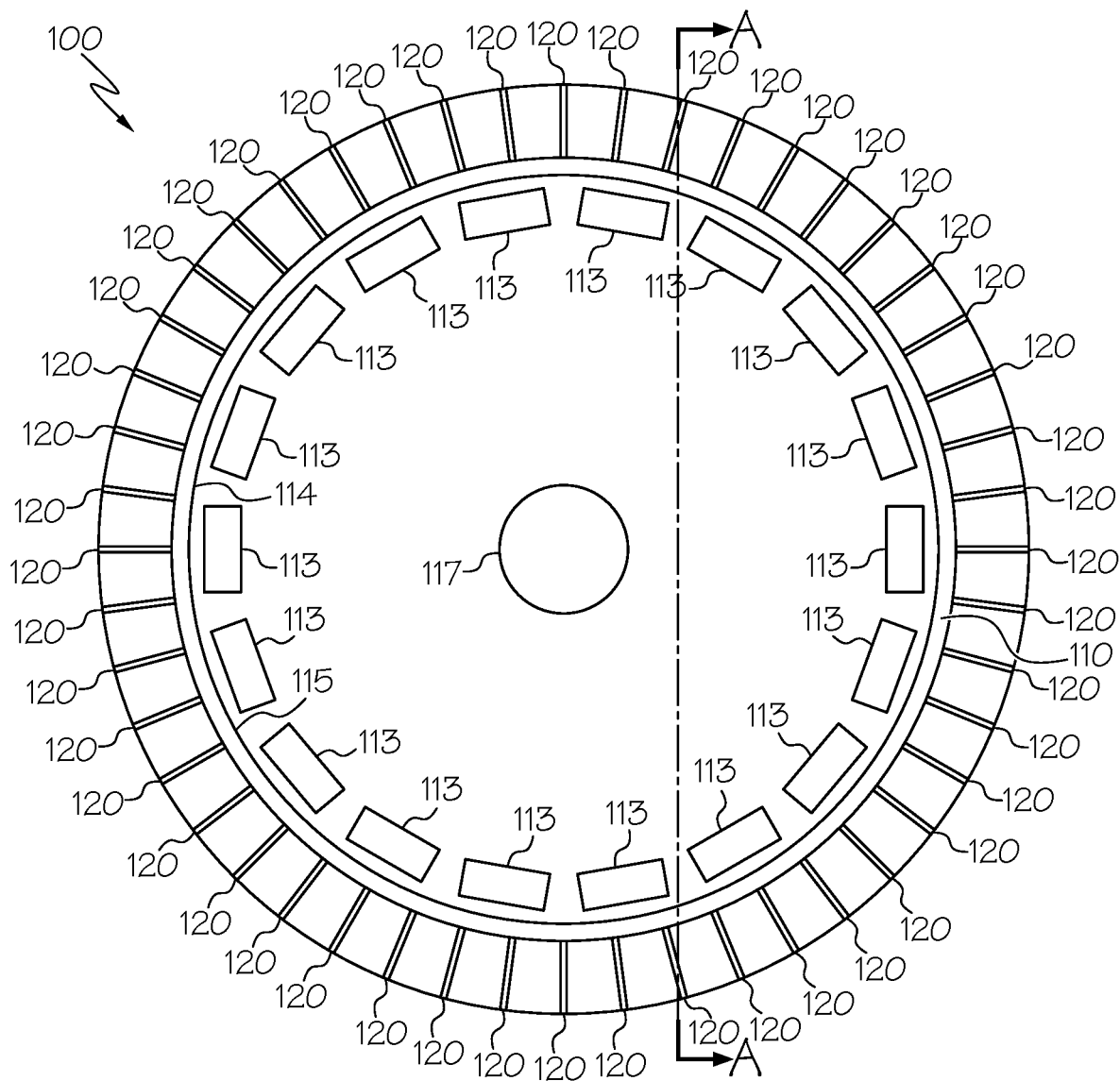
FIG. 2 schematically depicts a top view of a motor, casing, and fin assembly, according to one or more embodiments shown and described herein.

Referring now to FIG. 2, a top view of an embodiment of system 100 is shown. A plurality of fins 120 are shown protruding from casing outer surface 118. Pass through 117 is shown. Casing inner surface 115 is also shown. Electronic devices 113 are shown arranged around the casing perimeter 114, adjacent to casing inner surface 115. Cutting line plane A-A is shown.

Figure 3:
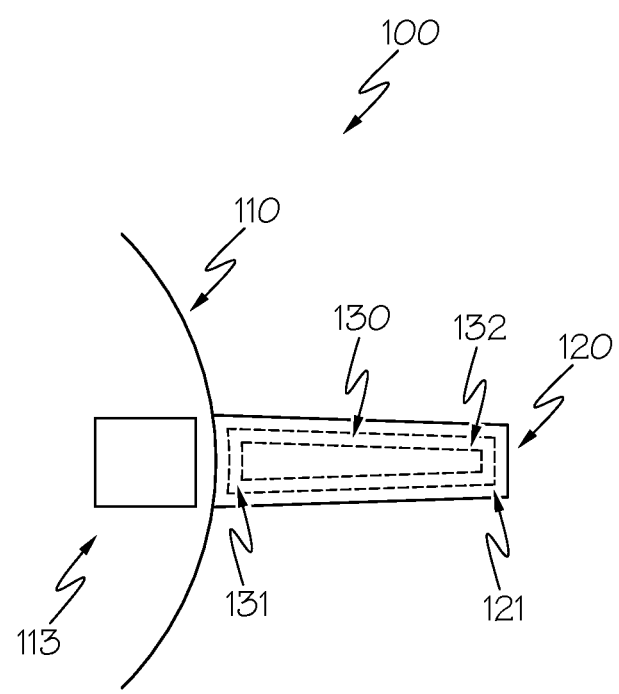
FIG. 3 schematically depicts a PHP disposed within a cooling fin, according to one or more embodiments shown and described herein.

Referring now to FIG. 3, a top view of an section of an embodiment of the system 100 including a PHP 130 embedded within a fin 120 is shown. Electronic device 113 is disposed within casing interior cavity 111. Fin 120 includes a fin interior cavity 121. A PHP 130 is disposed within the fin interior cavity 121. The PHP 130 includes a channel wherein alternating vapor plugs and liquid slugs of a refrigerant are placed within the channel. Any known or yet-to-be-developed refrigerant may be used. As a non-limiting example, R404A may be used as the refrigerant. In some embodiments, the PHP 130 includes a single circuit for the refrigerant inside of a single fin 120, such that the portion of the PHP 130 closest to the heat source can function as a PHP evaporator section 131, and the portion of the PHP furthest from the heat source can function as the PHP condenser section 132. In another embodiment not illustrated, the PHP 130 includes a plurality of circuits for the refrigerant inside of the fin 120 such that the PHP 130 includes a single closed loop wherein there are multiple PHP evaporator sections 131 closest to the heat source and there are multiple PHP condenser sections 132 furthest from the heat source in a single PHP 130.

Figure 4:
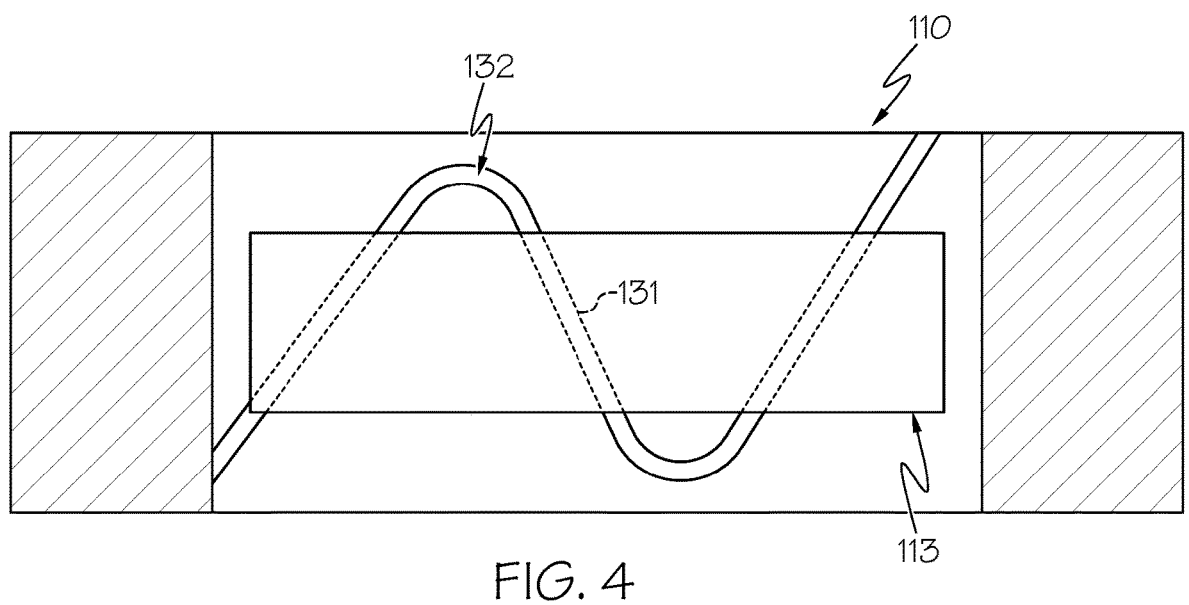
FIG. 4 schematically depicts a PHP disposed within a casing interior cavity, according to one or more embodiments shown and described herein.

Referring now to FIG. 4, a front view of a section cut along cutting plane line A-A of FIG. 2 is shown. In some embodiments, the PHP 130 includes a single circuit for the refrigerant inside of the casing interior cavity 111, such that the portion of the PHP 130 closest to the heat source can function as a PHP evaporator section 131, and the portion of the PHP furthest from the heat source can function as the PHP condenser section 132. In another embodiment, the PHP 130 includes a plurality of circuits for the refrigerant inside of the casing interior cavity 111 such that the PHP 130 includes a single closed loop wherein there are multiple PHP evaporator sections 131 closest to the heat source and there are multiple PHP condenser sections 132 furthest from the heat source in a single PHP 130.

While the fins 120 may be attached to the casing 110 by being attached to the casing outer surface 118 in some embodiments, it should be understood that in other embodiments the fin 120 may be attached to the casing 110 in other ways. In other embodiments, the fin segments 225 may be attached to the casing 210 through a plurality of slots in the casing 210.

Figure 5:
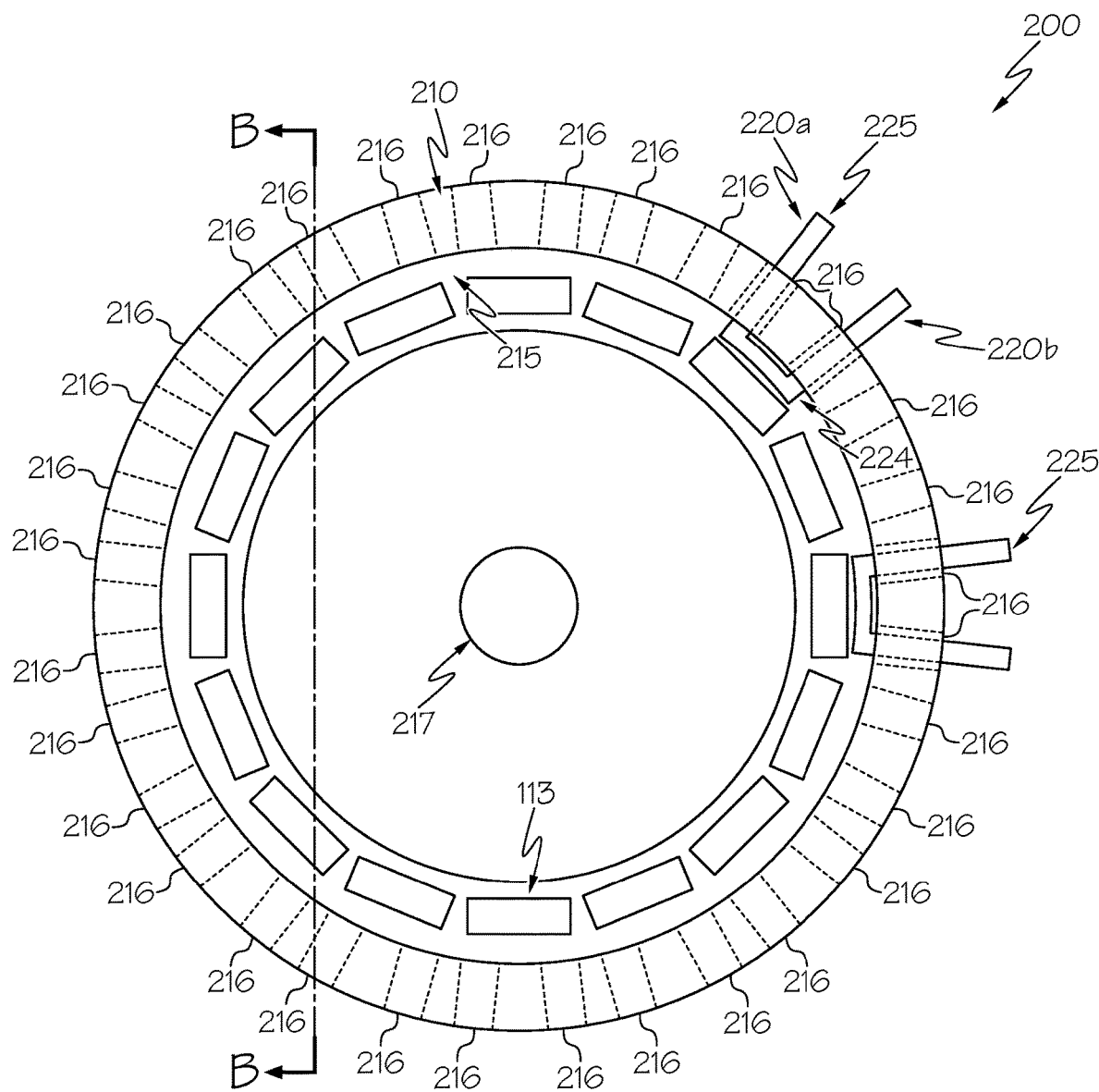
FIG. 5 schematically depicts a top view of a motor, casing, and fin segment assembly, according to one or more embodiments shown and described herein.

Referring now to FIG. 5, a top view of another embodiment of the system 100 is shown. A plurality of fin segments 225 are shown inserted through a plurality of slots 216 in the casing 210. The plurality of slots 216 may be arranged axially around the casing 210. A pass through 217 is shown. Casing inner surface 215 is also shown. Electronic devices 213 are shown arranged around the casing perimeter 214, adjacent to the casing inner surface 215. Cutting line plane B-B is shown.

Figure 6:
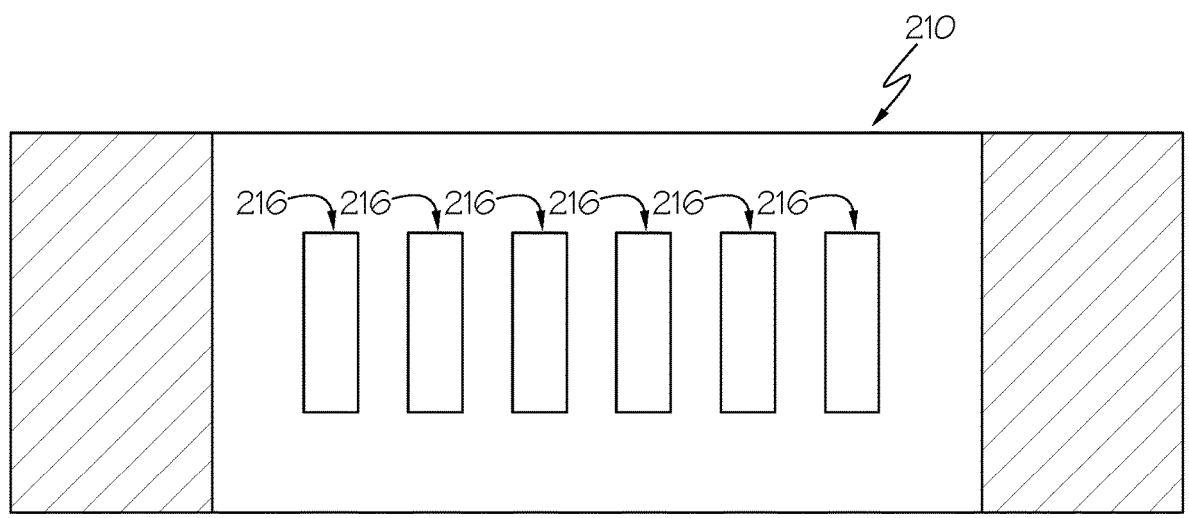
FIG. 6 schematically depicts a casing including a plurality of slots, according to one or more embodiments shown and described herein.

Referring now to FIG. 6, a front view of a section cut along cutting plane line B-B of an embodiment of the casing 210 with a plurality of slots 216 is shown. The slots 216 may be arranged in any arrangement around the casing 210. The slots 216 may be any number of shapes, including but not limited to rectangular or circular. The slots may be arranged in pairs.

Figure 7A:
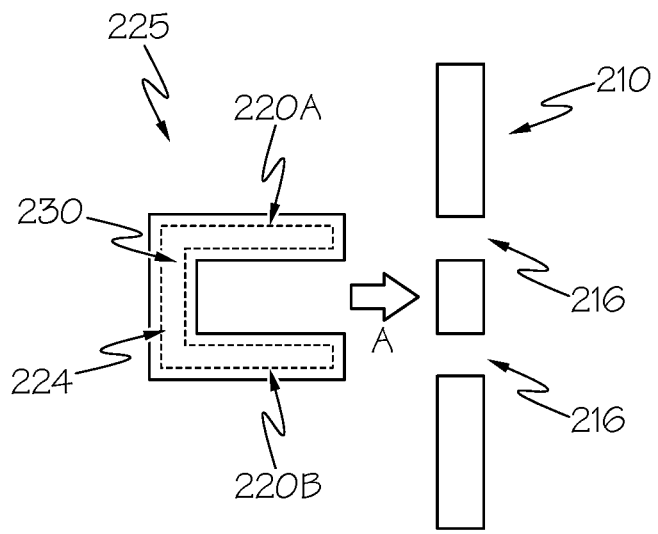
FIG. 7A schematically depicts a fin segment which is insertable into the plurality of slots of the casing, according to one or more embodiments shown and described herein.
Figure 7B:
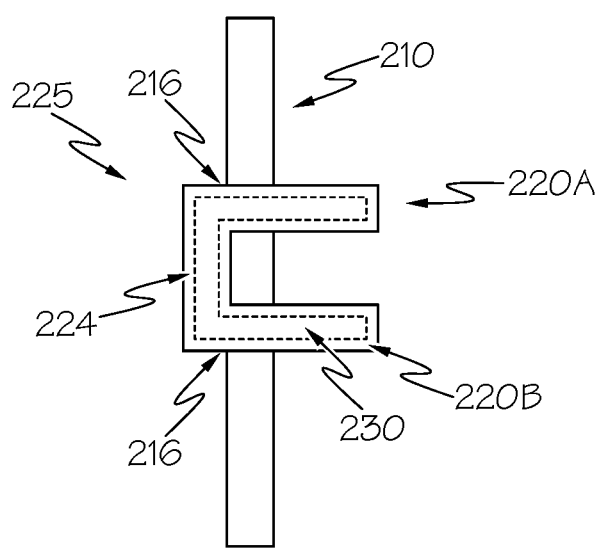
FIG. 7B schematically depicts a fin segment which has been inserted into two of the plurality of slots of the casing, according to one or more embodiments shown and described herein.

Referring now to FIGS. 7A and 7B, another embodiment of fins 220A, 220B and casing 210 are shown. In this embodiment, two fins 220A, 220B are provided by a single fin segment 225. The fin segment 225 is U-shaped having three portions wherein a first portion defines a first fin 220A, a second portion defining a second fin 220A that is parallel to the first fin 220A. The fin segment 225 further comprises a third portion defining a connecting portion 224 that connects the first fin 220A and the second fin 220B.

FIG. 7B depicts the fins 220A, 220B being inserted into slots 216 of the casing 210. Each fin 220A, 220B protrudes from the casing 210. The connecting portion 224 may be pressed against an inner surface of casing 210 and further contact one or more electronic devices. The fin segment 225 may be mechanically engaged with the casing 210 by fasteners (not shown) soldering, brazing, adhesive, or any bonding technique.

Each fin segment 225 includes a single contained PHP 230 as described above. In such embodiments, the condenser sections of the PHP 130 are present in the fins 220A, 220B while the evaporator section of the PHP 230 is present in the connecting portion 224. The electronic device warms the PHP 230 at the connecting portion 224 while air passing by the fins 220A, 220B cool the PHP 230.

A plurality of fin segments 225 may be disposed about the entire circumference of the casing 210, or a portion thereof. The system can include a plurality of PHPs 230 equal to the number of fins 220. This can allow a user to select an exact number of fin segments 225 and PHPs 230 customized for any situation. For example, when the system 200 is operated in an environment with a high ambient temperature, additional fin segments 225 can be provided. In an environment with a lower ambient temperature, fewer fin segments 225 may be provided.

Figure 8:
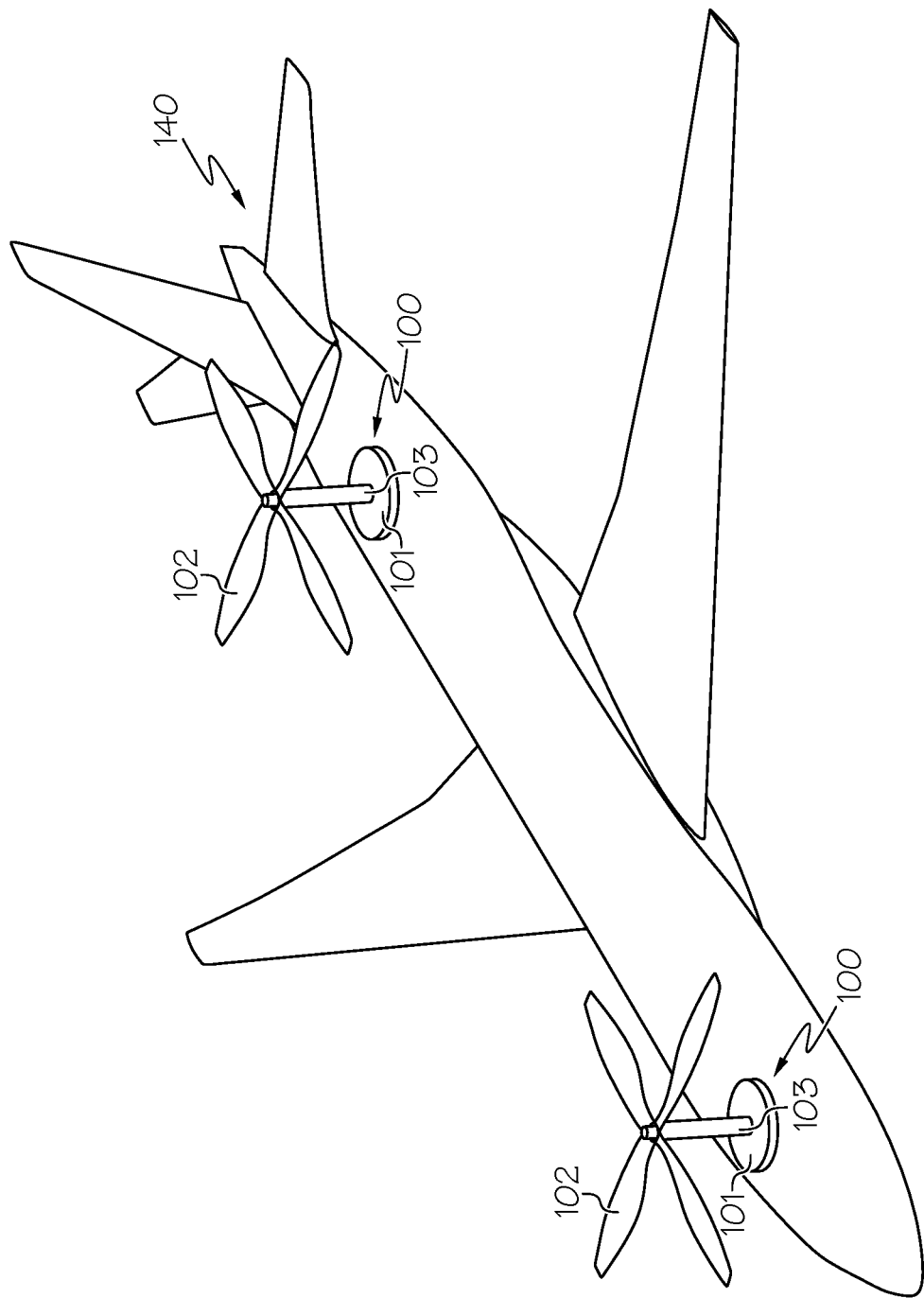
FIG. 8 schematically depicts an eVTOL with the cooling system, according to one or more embodiments shown and described herein.

Referring now to FIG. 8 the system 100 is shown on an eVTOL 140. A plurality of motors 101 coupled by a plurality of propeller shafts 103 to a plurality of propellers 102 may be used. The eVTOL 140 may use the lift from the plurality of propellers 102 to vertically takeoff and land. The plurality of propellers 102 may also provide thrust such that the eVTOL 140 can move forward. The airflow from the propeller 102 may also provide airflow to the fins 120 of the system 100. In an alternative embodiment, the airflow from the propeller 102 may also provide airflow to the fin segments 225. The airflow may allow for PHP condenser section 132 to condense the refrigerant inside of each PHP 130, which can cool the electronic devices 113.

The system 100 may allow for enhanced cooling of electronic devices 113 in electric aircraft, including eVTOL 140. The system 100 can include an embedded PHP in one or more fins 120. The system 100 further can be arranged by a user selecting a desired number of fin segments 225 to achieve a desired amount of cooling capability of the system 100. The fins 120 and fin segments 225 may be placed in the airflow of the plurality of propellers 102 such that the airflow may further cool the PHP condenser section 132 embedded within the fin 120 or the fin segment 225. The PHP 130 can allow for more efficient heat transfer across the entire fin 120 or the entire fin segment 225. This more efficient heat transfer can remove more heat from the electronic devices 113, which can allow the electronic devices 113 to operate more efficiently.

It may be noted that one or more of the following claims utilize the terms "where," "wherein," or "in which" as transitional phrases. For the purposes of defining the present technology, it may be noted that these terms are introduced in the claims as an open-ended transitional phrase that are used to introduce a recitation of a series of characteristics of the structure and should be interpreted in like manner as the more commonly used open-ended preamble term "comprising."

It should be understood that any two quantitative values assigned to a property may constitute a range of that property, and all combinations of ranges formed from all stated quantitative values of a given property are contemplated in this disclosure.

Having described the subject matter of the present disclosure in detail and by reference to specific embodiments, it may be noted that the various details described in this disclosure should not be taken to imply that these details relate to elements that are essential components of the various embodiments described in this disclosure, even in casings where a particular element may be illustrated in each of the drawings that accompany the present description. Rather, the claims appended hereto should be taken as the sole representation of the breadth of the present disclosure and the corresponding scope of the various embodiments described in this disclosure. Further, it will be apparent that modifications and variations are possible without departing from the scope of the appended claims.

What is claimed is:

1. An electric motor assembly comprising: a motor housing having an end face; a motor within the motor housing; an electronics assembly disposed on the end face of the motor housing, the electronics assembly comprising: a casing comprising a casing interior cavity and an outer surface, wherein the casing defines an enclosure; at least one electronic device within the enclosure; one or more fins protruding from the outer surface of the casing, wherein the one or more fins comprises a fin interior cavity; and one or more pulsating heat pipes disposed within both of the casing interior cavity and the fin interior cavity of the one or more fins.

2. The electric motor assembly of claim 1, wherein the casing interior cavity is coupled to the fin interior cavity of the one or more fins and the one or more pulsating heat pipes are disposed within both of the casing interior cavity and the fin interior cavity of the one or more fins.

3. The electric motor assembly of claim 1, wherein the casing interior cavity is an evaporator for the one or more pulsating heat pipes and the fin interior cavity is a condenser for the one or more pulsating heat pipes.

4. The electric motor assembly of claim 1, wherein the at least one electronic device comprises a plurality of electronic devices positioned along a perimeter defined by an inner surface of the casing.

5. The electric motor assembly of claim 4, wherein the at least one electronic device contacts the inner surface of the casing.

6. The electric motor assembly of claim 1, further comprising:
a propeller shaft coupled to the motor and passing through an opening of the casing; and
a propeller coupled to the propeller shaft, wherein rotation of the propeller causes air to pass by the one or more fins.

7. The electric motor assembly of claim 1, wherein the pulsating heat pipe has multiple condenser sections and multiple evaporator sections within a single fin.

8. An electric motor assembly comprising:
a motor housing having an end face;
a motor within the motor housing;
an electronics assembly disposed on the end face of the motor housing, the electronics assembly comprising:
a casing comprising a casing interior cavity and an outer surface, wherein the outer surface comprises a plurality of slots, and wherein the casing defines an enclosure;
at least one electronic device within the enclosure;
one or more fin segments comprising a first fin, a second fin, and a connecting portion that connects the first fin to the second fin, wherein the first fin and the second fin are inserted into the plurality of slots such that the first fin and the second fin protrude from the outer surface of the casing, wherein the first fin and the second fin each comprises a fin interior cavity; and
one or more pulsating heat pipes disposed within the fin interior cavity of the first fin and the second fin.

9. The electric motor assembly of claim 8, wherein the connecting portion of the one or more fin segments is an evaporator section of the pulsating heat pipe and the fin interior cavity of the first fin and the second fin is a condenser section of the pulsating heat pipe.

10. The electric motor assembly of claim 8, wherein the at least one electronic device comprises a plurality of electronic devices positioned along a perimeter defined by an inner surface of the casing, and the one or more fin segments comprises a plurality of fin segments.

11. The electric motor assembly of claim 10, wherein the at least one electronic device contacts the connecting portion of the plurality of fin segments.

12. The electric motor assembly of claim 8, further comprising:
a propeller shaft coupled to the motor and passing through an opening of the casing; and
a propeller coupled to the propeller shaft, wherein rotation of the propeller causes air to pass by the first fin and the second fin of the one or more fin segments.

13. The electric motor assembly of claim 8, wherein the pulsating heat pipe has multiple condenser sections and multiple evaporator sections within a single fin.

14. An electric vertical take-off and landing vehicle (eVTOL) comprising: an electric motor assembly comprising: a motor housing having an end face; a motor within the motor housing; an electronics assembly disposed on the end face of the motor housing, the electronics assembly comprising: a casing comprising a casing interior cavity and an outer surface, wherein the casing defines an enclosure; at least one electronic device within the enclosure; one or more fins protruding from the outer surface of the casing, wherein the one or more fins comprises a fin interior cavity; and one or more pulsating heat pipes disposed within both of the casing interior cavity and the fin interior cavity of the one or more fins.

15. The eVTOL of claim 14, wherein the casing interior cavity is coupled to the fin interior cavity of the one or more fins and the one or more pulsating heat pipes are disposed within both of the casing interior cavity and the fin interior cavity of the one or more fins.

16. The eVTOL of claim 14, wherein the casing interior cavity is an evaporator for the one or more pulsating heat pipes and the fin interior cavity is a condenser for the one or more pulsating heat pipes.

17. The eVTOL of claim 14, wherein the at least one electronic device comprises a plurality of electronic devices positioned along a perimeter defined by an inner surface of the casing.

18. The eVTOL of claim 14, further comprising:
- a propeller shaft coupled to the motor and passing through an opening of the casing; and
- a propeller coupled to the propeller shaft, wherein rotation of the propeller causes air to pass by the one or more fins.

* * * * *